(12) United States Patent
Hieronymi et al.

(10) Patent No.: US 6,299,740 B1
(45) Date of Patent: Oct. 9, 2001

(54) SPUTTERING ASSEMBLY AND TARGET THEREFOR

(75) Inventors: Robert G. Hieronymi, Monroe; Gary D. Lutz, Stony Point, both of NY (US)

(73) Assignee: Veeco Instrument, Inc., Plainview, NY (US)

( * ) Notice: Subject to any disclaimer, the term of this patent is extended or adjusted under 35 U.S.C. 154(b) by 0 days.

(21) Appl. No.: 09/487,082

(22) Filed: Jan. 19, 2000

(51) Int. Cl.$^7$ .................................................. C23C 14/35
(52) U.S. Cl. ........................... 204/192.12; 204/298.12; 204/298.19; 204/298.2; 204/192.2; 204/298.13; 204/298.03
(58) Field of Search ................... 204/298.12, 298.19, 204/298.2, 192.12, 192.2, 298.13, 298.03

(56) References Cited

U.S. PATENT DOCUMENTS

| | | | |
|---|---|---|---|
| 4,180,450 | * 12/1979 | Morrison, Jr. | 204/298.19 |
| 4,200,510 | 4/1980 | O'Connell et al. | 204/298.12 |
| 4,299,678 | * 11/1981 | Meckel | 204/298.12 |
| 4,324,631 | * 4/1982 | Meckel et al. | 204/298.19 |
| 4,412,907 | 11/1983 | Ito et al. | 204/192 R |
| 4,414,087 | * 11/1983 | Meckel | 204/298.19 |
| 4,500,408 | * 2/1985 | Boys et al. | 204/298.19 |
| 4,610,774 | 9/1986 | Sakata et al. | 204/192.15 |
| 4,619,755 | 10/1986 | Hessberger et al. | 204/192.12 |
| 4,834,860 | 5/1989 | Demaray et al. | 204/192.12 |
| 5,073,245 | 12/1991 | Hedgcoth | 204/298.21 |
| 5,174,875 | 12/1992 | Hurwitt et al. | 204/192.12 |
| 5,262,028 | 11/1993 | Manley | 204/298.16 |
| 5,415,754 | 5/1995 | Manley | 204/298.19 |
| 5,441,614 | 8/1995 | Krause et al. | 204/298.09 |
| 5,685,959 | * 11/1997 | Bourez et al. | 204/298.2 |
| 5,770,025 | * 6/1998 | Kiyota | 204/298.19 |
| 5,827,414 | 10/1998 | Westwood | 204/298.12 |
| 5,855,745 | * 1/1999 | Manley | 204/298.12 |

\* cited by examiner

*Primary Examiner*—Mark F. Huff
*Assistant Examiner*—Daborah Chacko-Davis
(74) *Attorney, Agent, or Firm*—Nilles & Nilles, S.C.

(57) ABSTRACT

A cathode assembly includes a monolithic target having a first surface and a center region. In addition, a sculpted section is formed in the first surface, and the sculpted section is generally recessed from the first surface and extends around the center in a racetrack configuration. The racetrack has a concentric centerline, and the sculpted section preferably is generally symmetric about the centerline. A magnetic field generator is disposed adjacent to the target and produces a magnetic field having an in-plane component. The magnetic field generator is tuned so that a distribution of the magnitude of the in-plane component in a direction transverse to the centerline at a point along the racetrack is characterized by two peaks that have a generally equal magnitude.

21 Claims, 7 Drawing Sheets

SPUTTERING ASSEMBLY AND TARGET THEREFOR

BACKGROUND OF THE INVENTION

1. Field of the Invention

The present invention is directed to a cathode assembly including a target made of a soft magnetic material for use with a sputtering apparatus and, more particularly, to an apparatus and method for improving efficient use of the target.

2. Description of the Related Art

Sputter or physical vapor deposition (PVD) systems are well known and typically include a cathode assembly having a target made of a material to be deposited on a substrate, for example, a wafer. Typically, the cathode assembly of the sputtering apparatus is disposed in a vacuum chamber into which a gas, such as non-oxidizing argon, is introduced. In operation, power is supplied to the cathode, thus ionizing the gas.

The cathode assembly includes a magnetic field source that generates a magnetic field that focuses the plasma, thus causing a pool of ionized atoms to be available for acceleration towards the surface of the target. This bombardment of ionized atoms causes the metal atoms of the target to be sputtered from the target and deposited as a film on the substrate.

Notably, conventional magnetron sputtering or PVD of soft magnetic material (i.e., material easy to magnetize/demagnetize) results in inefficient use of the target material. This is due to the fact that the magnetic flux generated by a conventional magnetic field source causes a high density of ions to bombard the target in a confined area. More specifically, the magnetic field source is configured such that the magnetic field exhibits a cascading effect of narrow magnetic confinement which leads to formation of narrowing magnetic gaps, thus causing deep erosion in a relatively confined area. There is a progressive worsening of the erosion width to depth ratio, commonly referred to as erosion "cusping," the longer the apparatus is operated.

Figure 1A:
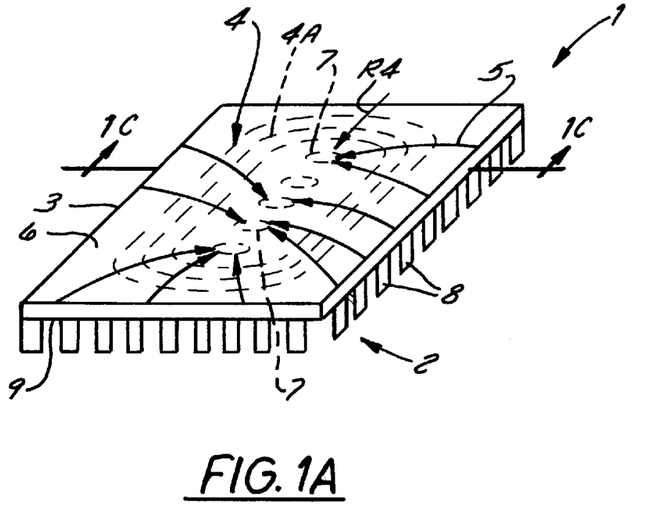
FIG. 1A is a perspective view of a cathode assembly showing an eroded portion of the target surface in a racetrack pattern.
Figure 7A:
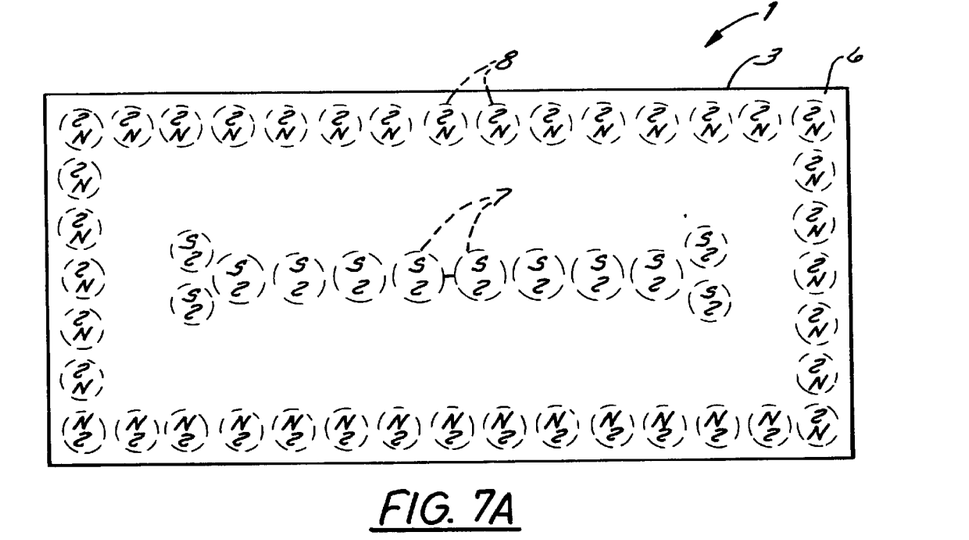
FIG. 7A is a top plan view of a cathode assembly showing the magnets of the magnetic field source which produces a magnetic field having an in-plane component on a non-sculpted surface as shown in FIG. 5A.

For a standard cathode assembly 1 of a planar magnetron having a target 3 subject to magnetic field source 2, erosion occurs generally around the perimeter of the target 3 in a "racetrack" pattern 4 on surface 6, as shown in FIG. 1A. Magnetic field source 2 includes a plurality of inner magnets 7 (shown in dashed lines) having a first polarity and a plurality of outer magnets 8 having a second, opposite polarity (with the southern pole of magnets 8 being disposed generally adjacent a rear surface 9 of target 3), as shown in FIGS. 1A and 7A. With this magnet configuration, the magnetic flux lines form a family of curves 5 each having the shape of a tunnel and extending around the target generally in the racetrack pattern 4 to focus the plasma. As the magnetic field is observed closer to the target surface, the tangential, or in-plane, component of the magnetic field becomes infinitely smaller and approaches a point. It is this "point" of the magnetic field that significantly contributes to erosion cusping. Notably, erosion cusping occurs at about the centerline 4A of the racetrack 4.

Figure 1B:
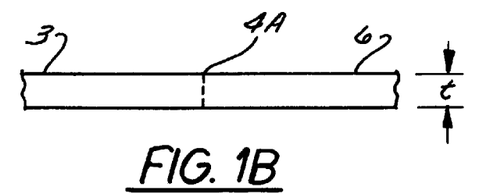
FIG. 1B is an end elevational view of the target structure shown in FIG. 1A, prior to erosion.
Figure 1C:
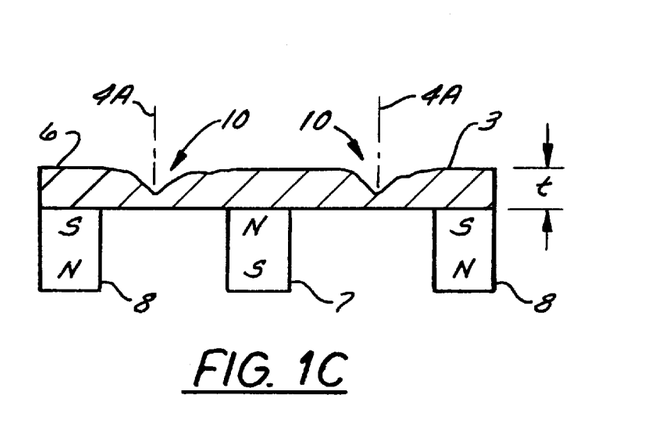
FIG. 1C is a cross-sectional view of the cathode assembly of FIG. 1A, taken along line 1c—1c showing erosion cusping at a centerline of the racetrack shown in FIG. 1A.

This phenomenon is shown more prominently in FIGS. 1B and 1C. FIG. 1B shows a portion of target 3 prior to sputtering, the target being made of a ferromagnetic material having a predetermined thickness (t) and having, for example, a generally rectangular shape. In FIG. 1C, target 3 is shown after approximately twenty kilowatt-hours of sputtering target 3 is shown to have undergone erosion cusping.

The attendant erosion of target 3 is concentrated in a defined region 10 of the racetrack, and extends nearly entirely through the thickness (t) of the target. As a result, the target must be replaced even though a large majority of the target outside the cusp area is unutilized.

Other ferromagnetic target designs have been proposed with, at best, marginal improvement in the efficiency of target utilization over the above described system. For example, one known system utilizes slots formed entirely (or nearly entirely) through the target so as to avoid concentration of the erosion at a particular region. Although this known method can make a magnetic material behave like a nonmagnetic material, and thus improve utilization of the target, such a target typically exhibits "feathering" of the erosion near the discontinuities between the slots, thus generating particulate from the target structure after multiple hours of operation. As a result, the backplate to which the target is mounted may be exposed to ion bombardment, thus causing unwanted overheating/sputtering of the cathode assembly. Moreover, the target is cleaned prior to being installed for use and, when such slots are included, this cleaning process is made extremely difficult, with a higher risk of contaminates being left on the target. In addition, forming the slots makes such targets relatively difficult to manufacture and causes a significant portion of the target to be wasted.

As a result, the field of sputter deposition of soft magnetic materials is in need of an apparatus and method for distributing the density of ion bombardment on the associated target in such a way as to provide more uniform erosion of the target to increase the effective life of the target. The apparatus and method should avoid problematic erosion cusping while maximizing the amount of target material ultimately used, thus increasing system up-time by increasing the time between target changes and reducing the user's end cost.

SUMMARY OF THE INVENTION

The present invention provides an apparatus and method for maximizing target utilization by ensuring that the ion density near the target surface is not concentrated at any particular point or region, thus avoiding the problem of erosion cusping. The cathode assembly preferably utilizes a magnetic field generator having conventional configuration, but with unconventional components including magnet assemblies that allow tuning of the magnetic field. More particularly, by tuning the magnitude of the tangential component (i.e., the component(s) of the magnetic field parallel to the target surface and most responsible for the extent of concentrated target surface erosion) of the magnetic field, ion concentration can be selectively minimized at a particular location, e.g., at the racetrack centerline where, as described previously, erosion cusping is most prominent. In addition to tuning the magnetic field, the preferred embodiment also requires a target that has a sculpted surface to facilitate erosion that is generally uniform transverse to the racetrack centerline.

According to one aspect of the preferred embodiment, a sculpted target for a sputtering apparatus includes a monolithic plate made of a soft magnetic material, the plate having a first surface and a center. In addition, the target has a sculpted section formed in the first surface. The sculpted section is generally recessed from the first surface and extends around the plate center in a racetrack configuration, wherein the racetrack has a concentric centerline. Notably, the sculpted section is generally symmetric about the centerline.

According to another aspect of the preferred embodiment, the sculpted section includes a plurality of generally adjacent trenches formed in the first surface, wherein an equal number of the trenches flank either side of the centerline. Moreover, each trench has an associated depth with the depths progressively increasing as the associated trenches are displaced generally further from the centerline.

According to a further aspect of the preferred embodiment, a cathode assembly includes a monolithic target having a first surface and a center region. In addition, a sculpted section is formed in the first surface, and the sculpted section is generally recessed from the first surface and extends around the center in a racetrack configuration. The racetrack has a concentric centerline, and the sculpted section preferably is generally symmetric about the centerline. A magnetic field generator is disposed adjacent to the target and produces a magnetic field having an in-plane component. The magnetic field generator is tuned so that a distribution of the magnitude of the in-plane component in a direction transverse to the centerline at a point along the racetrack is characterized by two peaks that have a generally equal magnitude.

According to yet another aspect of the preferred embodiment, a method of making a cathode assembly for sputtering a target made of a particular material includes the steps of using a target having a first surface to be sputtered and a second surface opposite the first surface, and then forming a sculpted portion in the first surface. Thereafter, the method includes disposing a magnetic field generator generally adjacent to the second surface to generate a magnetic field having an in-plane component, and thereafter tuning the magnetic field so as to avoid erosion cusping of the first surface during a sputtering operation.

According to another aspect of the method of the preferred embodiment, the magnetic field generator includes a plurality of magnet assemblies having a stack of elements, and the tuning step includes (1) selecting a combination of the elements, whereby the elements are selected from a group comprising: a magnet, an air gap, and a soft magnetic spacer, and then (2) measuring the magnitude of the in-plane component of the magnetic field for each point along a line transverse to the centerline to create a magnitude distribution associated with the line. Then, the selecting and measuring steps are repeated until the distribution includes two peaks.

These and other objects, features, and advantages of the invention will become apparent to those skilled in the art from the following detailed description and the accompanying drawings. It should be understood, however, that the detailed description and specific examples, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

A preferred exemplary embodiment of the invention is illustrated in the accompanying drawings in which like reference numerals represent like parts throughout, and in which:

FIG. 3A is a partially broken away cross-sectional view of the target shown in FIG. 2, taken along line 3a—3a;

DETAILED DESCRIPTION OF THE PREFERRED EMBODIMENTS

Figure 2:
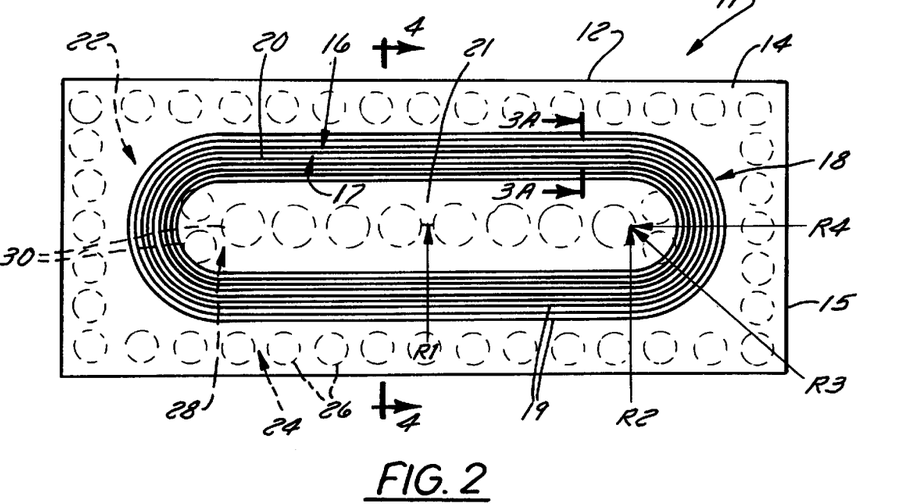
FIG. 2 is a top plan view of a cathode assembly according to a preferred embodiment of the present invention, including a sculpted target.

Referring initially to FIG. 2, a cathode assembly 11 includes a target 12 that forms a plate having a first surface 14 and a perimeter edge 15. The first surface 14 includes sculpted portions 16, 17 formed therein so as to be generally recessed from first surface 14. Notably, sculpted portions 16, 17 together form a racetrack configuration 18 on first surface 14 of target 12, racetrack 18 having a centerline 20 that is flanked on either side by one of sculpted portions 16, 17 and defining a center 21 of the target. Notably, target 12 is a monolithic structure made of soft magnetic material such as a nickel-iron (Ni/Fe) 18.6 weight percent permalloy and is approximately ⅛" thick, although many other materials having varying dimensions may be used. In the preferred embodiment, sculpted portions 16, 17 each include a plurality of trenches 19 described in further detail below. Four trenches are on either side of centerline 20 shown but any number of trenches of various configurations may be used.

As discussed in further detail below, the racetrack configuration 18 of sculpted portions 16, 17 generally corresponds to the pattern of erosion which results from a conventional cathode assembly having a magnetic field source that generates a non-tuned magnetic field, and which has a non-sculpted target, as shown in FIG. 1A. In fact, centerline 20, in the plane of the first surface 14, is formed to generally coincide with the point of erosion cusping (5 in FIG. 1C) caused by sputtering a target with such a system.

Figure 3A:
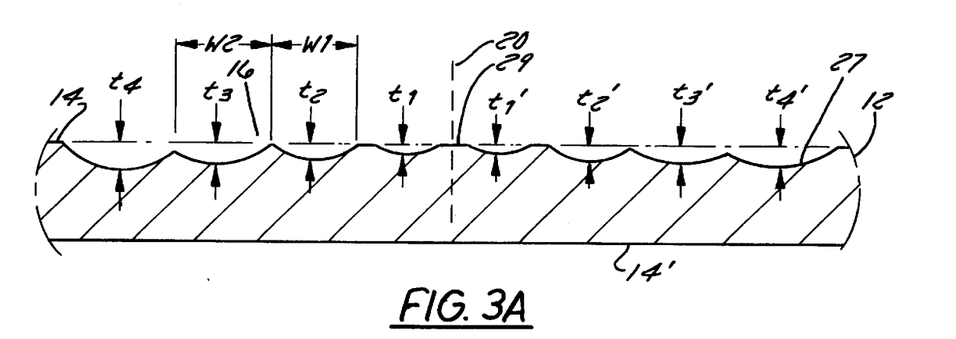
Figure 4:
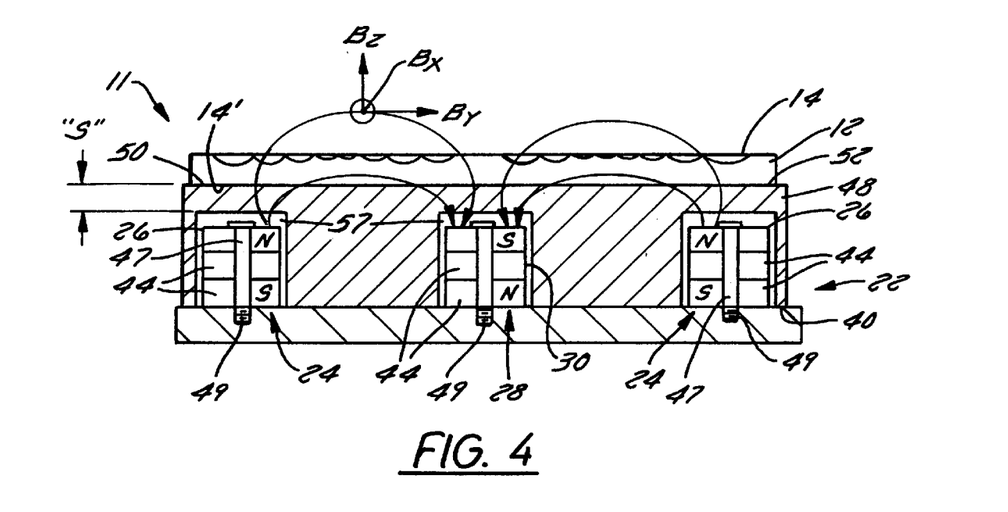
FIG. 4 is a cross-sectional view of the cathode assembly shown in FIG. 2, taken along line 4—4.

Referring now to FIGS. 2 and 4, cathode assembly 11 also includes a magnetic field generator 22 (shown in phantom in FIG. 2) having an outer array 24 of magnet assemblies 26 disposed generally adjacent the perimeter of second surface 14' (FIG. 3A) of target 12. Also, magnet field generator 22 includes an inner array 28 of magnet assemblies 30 disposed generally adjacent the center of second surface 14' (FIG. 3A) of target 11 in an area of the second surface that is generally within the racetrack formed by sculpted portions 16, 17.

Turning to FIG. 3A, target 12, and more specifically a cross section of one leg of the racetrack formed by sculpted portions 16, 17, is shown. Sculpted portions 16, 17 are formed in first surface 14 of target 12, while a second or bottom surface 14' of target 12 is used to couple target 11 to a backing plate (48 in FIG. 4). Preferably, sculpted portions 16, 17 are symmetrical about centerline 20 and comprise a series of generally adjacent trenches 19 of varying depth. In this preferred embodiment, the depths ($t_1$–$t_1'$, $t_2$–$t_2'$, $t_3$–$t_3'$, $t_4$–$t_4'$) of trenches 19 increase moving outwardly away from the centerline 20 in a transverse direction around the racetrack (as shown with each arrow R1–R4 in FIG. 2, for example). Preferably, sculpted portions 16, 17 are formed using a quarter-inch end mill or other suitable tool which affords relatively inexpensive, yet precise, machining of the sculpted portions 16, 17. In the preferred embodiment, four trenches 19 are formed having successive depths generally equal to, $t_1$=0.010, $t_2$=0.017, $t_3$=0.024, $t_4$=0.032.

Although many other depth variations may be found suitable upon use, the bottom surface 27 of each trench is preferably curved or spherical. In addition, as they are displaced farther from centerline 20, the trenches not only are deeper but they are wider due to the use of a quarter-inch end mill (i.e., w1<w2). Moreover, the trenches farthest from centerline 20 are displaced approximately 0.438 inches from the centerline to their lowest point. Preferably, trenches 19 are formed on either side of centerline 20 in symmetric fashion. A centerline surface 29 of first surface 14 is flat and generally coplanar with the non-sculpted portions of the first surface. Notably, forming more than four trenches with a quarter-inch end mill has a detrimental affect on the uniformity of the erosion because the available magnetic field is spread too thin, thus lowering the field at any one point. Further, although not preferred, to develop an improved surface finish which is required for high quality sputtering, trenches 19 may be banked or slanted, particularly at the corners of the racetrack 18. Overall, the above-noted specifications of trenches 19 have been found to produce the most uniform amount of erosion after extended sputtering operation, but trenches and trench arrangements of other configurations may be suitable.

Figure 3B:
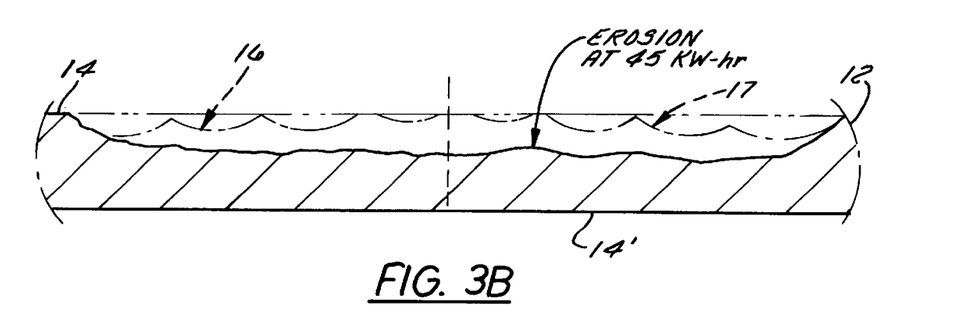
FIG. 3B is a partially broken away cross-sectional view similar to FIG. 3A, showing the target after approximately forty kilowatt-hours of operation.

The microstructure of target 12 is preferably fine grained, randomly oriented (e.g., crystal) and homogeneous. As will become apparent from the discussion below, it is this combination of sculpted portions 16, 17 in target 12 that increase in depth when moving in a direction transverse to the centerline 20 of the racetrack, and tuning the magnetic field produced by magnetic field generator 22 (FIGS. 2 and 4) that allows the preferred embodiment to achieve uniform erosion of first surface 14 of target 12 in a region generally coincident with the racetrack (see FIG. 3 and discussion below).

Turning to FIG. 4, a planar magnetron sputtering system 31 includes cathode assembly 11 which comprises target 12 and magnetic field generator 22 for depositing a film of the target material on a substrate 32. In operation, a voltage from a power supply (not shown) is applied to the cathode assembly to ionize a nonoxidizing gas (such as argon) placed in an evacuated chamber (not shown). Generator 22 produces a magnetic flux, thus causing a series of plasma-containing magnetic tunnels to form around racetrack 18 (FIG. 2). The ionized atoms bombard first surface 14 of target 12 and sputter the target material which, as described above, is any suitable soft magnetic material such as nickel iron, cobalt iron, or others. The sputtered soft magnetic material is then deposited on a surface 33 of substrate 32. Permanent magnets 56, 58 are disposed adjacent opposite sides of the substrate to preferentially align the sputtered magnetic material so as to cause the material to deposit/condense on surface 33 with a particular polarity. Notably, the magnitude of the flux generated by magnets 56, 58 is carefully controlled to minimize the effects of cross-talk between the fields generated by generator 22 and magnets 56, 58.

Magnetic field generator 22 includes outer array 24 of magnet assemblies 26 and inner array 28 of magnetic assemblies 30, with each magnet assembly 26, 30 including a stack of tuning elements 44 (three, for example) that may comprise any combination of magnets, spacers, and air gaps depending upon which combination produces the desired magnetic field. More particularly, a combination of elements 44 is chosen based upon which arrangement of elements 44 produces a magnetic field that most likely will maintain uniform erosion of target 12. Tuning of the magnetics is described in further detail below.

Figure 4A:
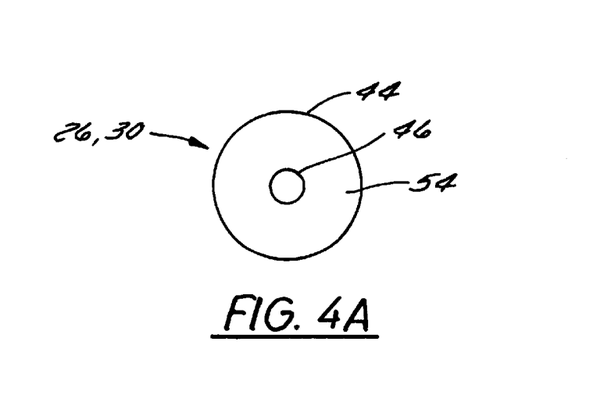
FIG. 4A is a top plan view of a magnet assembly associated with the magnetron of the preferred embodiment.

Magnet assemblies 26, 30 are coupled to a shunt plate 40 that, in addition to holding magnet assemblies 26, 30, operates to close the loop on the magnetic field generated by magnet assemblies 26, 30, and therefore is preferably made of a "soft" magnetic material such as a mild steel or a magnetic grade of stainless steel. Referring to FIG. 4A, each element 44 of the stacks which comprise magnet assemblies 26, 30 is preferably cylindrical and has an opening 46 formed in its center (unless, of course, element 44 is an air gap) to accommodate a releasable fastener 47, such as a screw, to readily allow combinations of different ones of elements 44 to be coupled to corresponding openings 49 (FIG. 4) formed in shunt plate 40. Each element 44 of magnet assemblies 26, 30 has a top surface 54 and a bottom surface (not shown) which abuts a like surface of an adjacent one of elements 44 in a corresponding one of the magnet assemblies 26, 30.

Target 12 of cathode assembly 11 includes a back surface 14' that is bonded to a backing plate 48 having a first flat surface 50 via a solder layer 52, preferably comprising indium/tin (InSn) or other suitable material. To accommodate magnet assemblies 26, 30, backing plate 48 includes cylindrical openings 57 corresponding to each magnet assembly 26, 30 of outer and inner arrays 24, 28, respectively. Openings 57 do not extend entirely through the thickness of backing plate 48; rather, a portion of backing plate 48 maintains a solid thickness "s" such that flat surface 50 of backing plate 48 can be securely bonded to back surface 14' of target 11. Notably, as the defined thickness "s" of backing plate 48 is made smaller, system 31 can more efficiently sputter magnetic materials as the magnetic flux passes through less of the backing plate. Preferably, backing plate 48 is made of copper or some similar efficient thermal conductor, and includes cooling channels (not shown) through which water is passed to cool target 12 during sputtering.

What follows is a description of how the magnetic field produced by magnetic field generator 22 is tuned to provide a magnetic field that causes uniform erosion of target 11 during sputtering. Generally, tuning the magnetic field generated by magnetic field generator 22 is performed by measuring the magnetic field associated with multiple points along a line transverse to the centerline at different locations around the entire racetrack. At any point around the racetrack, the measured magnetic field includes three components, $B_x$, $B_y$ and $B_z$, as shown in FIG. 4. Further, the magnetic field associated with $B_x+B_y$ is the tangential or in-plane (with first surface 14 of target 12) component of the magnetic field which, as described previously, causes erosion cusping if concentrated in any one area. Based on these measurements, a derived curve indicative of an erosion pattern after extended sputtering can be generated. The measurements are made with a Bell gauss meter and a custom probe assembly having three Hall elements corresponding to the three field orientations. The $B_y$ and $B_x$ Hall elements are centered about 0.16" above the undisturbed target surface plane, while the $B_z$ hall element is centered approximately 0.10" above the undisturbed target surface plane. The probe preferably is mounted on a fixture and has a measuring surface square to target surface 14 measuring approximately $1/16^{th}$ of an inch by $1/16^{th}$ of an inch.

Figure 5A:
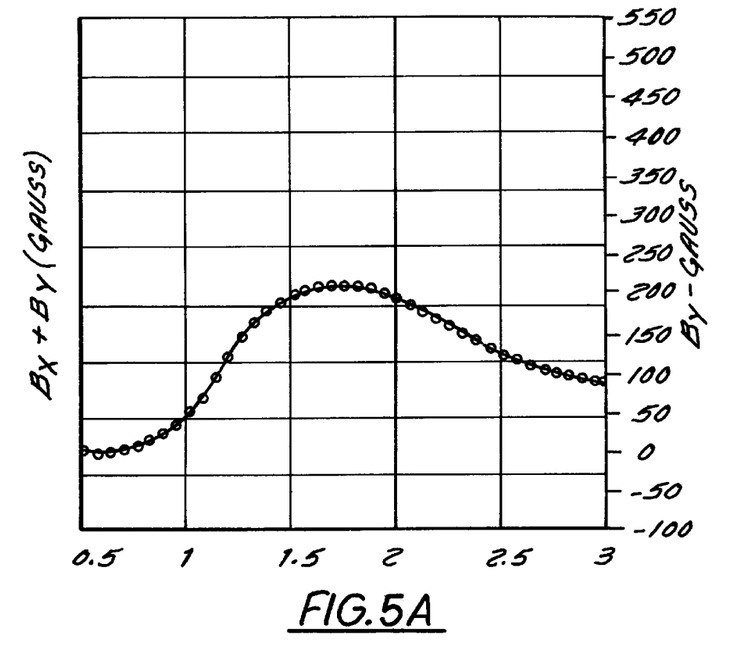
FIG. 5A is a diagram showing the in-plane component of a magnetic field produced by a non-tuned magnetic field source generally as a function of the distance of the measuring point from the edge of the non-sculpted target.

Turning initially to FIGS. 5A, 5B, 6A, and 6B, diagrams depicting the magnetic field strength output by a conventional non-tuned, non-sculpted. sputtering apparatus (FIGS. 5A and 5B) and by a sputtering apparatus according to the preferred embodiment (FIGS. 6A and 6B) are shown. Note that the target used is a monolithic square plate 5.94 inches wide by 13.44 inches long, and approximately one-eighth inch thick at its edge. In FIG. 5A, the magnetic field generated by the magnetic source of a conventional planar magnetron is measured with the above-described probe at multiple points (preferably, precisely every $1/16^{th}$ of an inch) along the path marked R4 in FIG. 1A (R4 being transverse to the racetrack centerline 5). Note that the measurement points are plotted, for R4, as a function of the distance of the measuring point from the target edge. FIG. 5A; showing the in-plane component $\sqrt{B_{x^2}+B_{y^2}}$ of the magnetic field generated by a cathode of a conventional sputtering apparatus, includes one rounded peak approximately positioned at the racetrack centerline (4A in FIG. 1A) which is the position of the inflection point of the Z-direction magnetic field, i.e., where the Z component switches from pointing straight up to straight down, or vice-versa, resulting in a large in-plane component of the magnetic field to be sharply localized. It is this peak that is responsible for the erosion cusping shown in the non-tuned, non-sculpted system of FIG. 1C, the cusping being positioned generally at the centerline (4A in FIG. 1A) of the erosion racetrack 4.

Figure 5B:
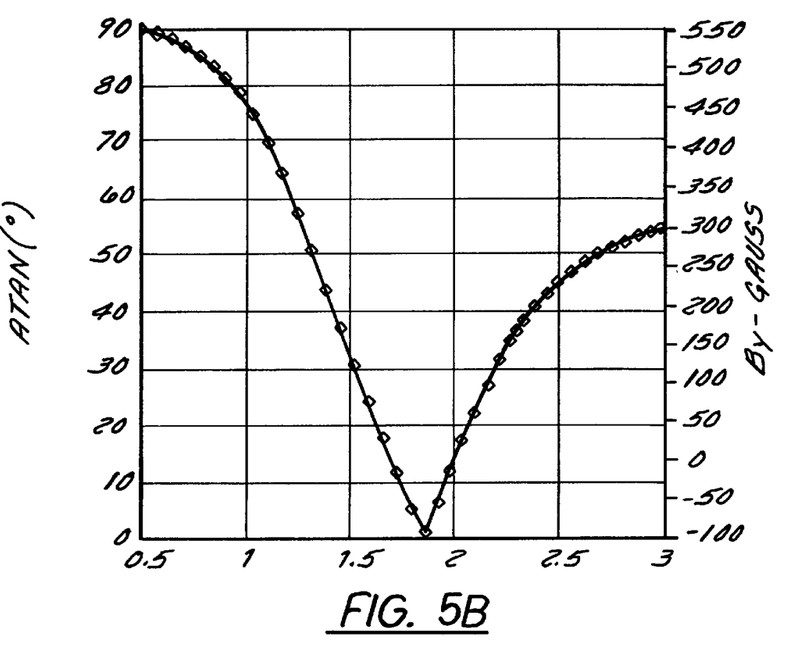
FIG. 5B is a diagram indicative of the erosion caused by a non-tuned, non-sculpted cathode assembly.

This cusping is most apparent when looking at the derived curve shown in FIG. 5B, which is the arc tangent of the quantity of the Z direction magnetic field over the square root of the quantity equal to the Y direction magnetic field squared plus the X direction magnetic field squared or $$a\tan\left(\frac{B_z}{\sqrt{(B_y^2+B_x^2)}}\right)$$

The curve in FIG. 5B is analyzed with respect to the length (approximately 0.5 inches) over which the vector field angle is maintained at approximately $\leq 10°$ to the plane of first surface 14. Notably, the peak of the derived curve shown in FIG. 5B generally corresponds to the peak of the in-plane component of the magnetic field measured at the corner (R4), as shown in FIG. 5A. In other words, FIG. 5B is indicative of the erosion caused by an untuned magnetic flux source which is shown schematically in FIG. 1C with erosion cusping at the centerline, approximately where the peak occurs.

Figure 6A:
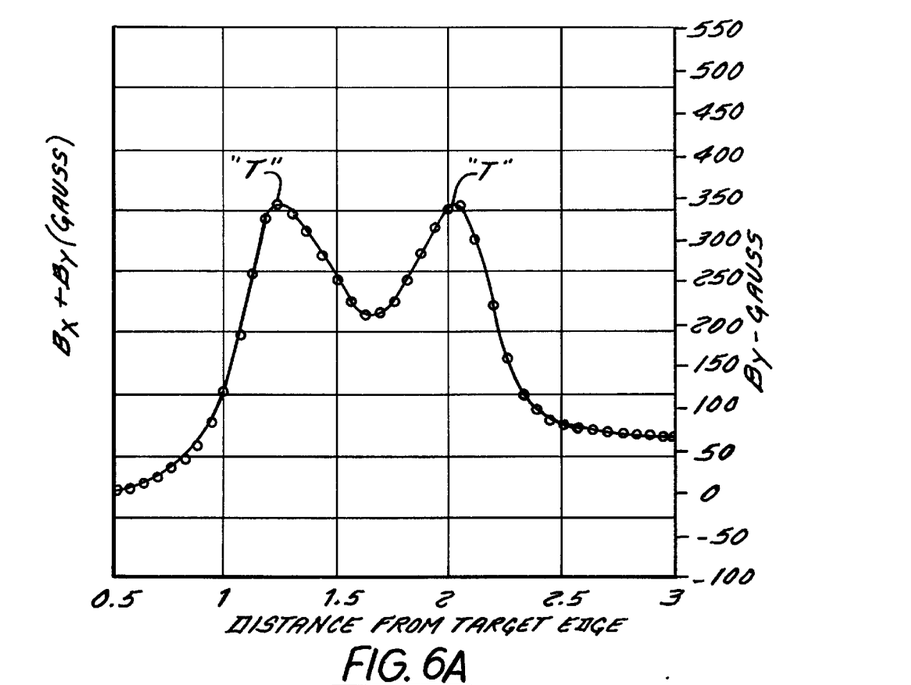
FIG. 6A is a diagram showing the in-plane component of the magnetic field generated on the sculpted target surface after tuning the magnet assemblies of the magnetic field generator shown in FIG. 4.

Turning next to FIG. 6A, the distribution of the magnitude of the in-plane component of the magnetic field generated by magnetic field generator 22 of system 31 (FIG. 4) is measured at points along R4 spanning a distance over which the vector field angle is maintained at approximately $\leq 10°$ to the plane of first surface 14, approximately 0.5 inches. The distribution includes twin peaks (marked "T") that generally flank the centerline (20 in FIG. 2) of the racetrack 18 at location R4 (FIG. 2). Preferably, the distribution of the magnitude of the field goes through a minimum of approximately 180–200 gauss directly above the racetrack centerline, and has maximum values ("T") between 300–350 gauss above the outermost trenches.

Figure 6B:
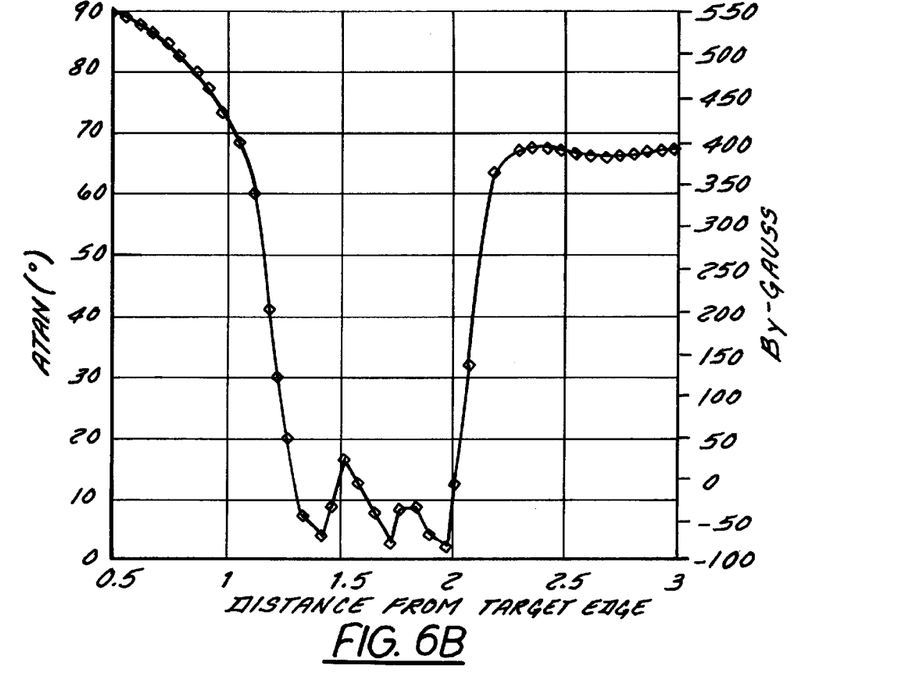
FIG. 6B is a diagram indicative of the erosion caused by the tuned magnetic field on the sculpted target surface shown in FIG. 6A.

In the derived curve shown in FIG. 6B (i.e., the atan($B_z$/($B_y+B_x$)), the sharp peak produced by the conventional non-tuned, non-sculpted system is "smoothed" out, in relative terms. By eliminating the single sharp peak associated with the in-plane component of the magnetic field generated by the sputtering system, the preferred embodiment virtually eliminates erosion cusping while causing uniform erosion over a significantly wider area. The resultant uniform erosion profile at position R4 at about 45 kW-hrs is shown schematically in FIG. 3B. Notably, when tuning the magnetics, the operator attempts to equalize the magnitudes of the two peaks shown in FIG. 6A as closely as possible. Further, the more symmetric the two peaks are with respect to the centerline, there is a higher degree of "smoothing" of the peak shown in FIG. 5B. This is realized through a process of trial and error, measuring the in-plane component of the magnetic field as different combinations of elements 44 of magnet assemblies 26, 30 (FIG. 4) are assembled and the magnetic field measured at a plurality of points along lines transverse to the centerline of the racetrack.

This tuning process involves selecting different combinations of magnets (preferably, neodymium-iron-boron ($N_dF_eB$) magnetized at about 2500 gauss at its pole face-interference between the magnetic flux of stabilizing magnets 56, 58 and the magnetic flux output by generator 22 is to be minimized, as described previously), air gaps and spacers (preferably a soft magnetic element such as a mild steel) at a particular location along the racetrack (R4, for instance). Thereafter, the magnetic field is measured with the three axis Hall sensor, as described above. Depending upon the target material used (e.g., nickel-iron, cobalt-iron, etc.), different elements 44 must be chosen for magnet assemblies 26, 30 to achieve the desired "two-peak" distribution of the in-plane component of the magnetic field shown in FIG. 6A, for each location around the racetrack. Notably, it is extremely difficult to exactly balance the magnitude of the peaks and their positions relative to the centerline. Nevertheless, as long as the peaks are within approximately ±5% of each other (sum of peak values/difference of peak values x 100%), the desired erosion profile will be realized.

More particularly, tuning the magnets initially involves finding the racetrack centerline, thus providing a necessary reference when forming sculpted portions 16, 17 (FIG. 2) in first surface 14 of racetrack 12. Preferably, the racetrack centerline of the preferred embodiment corresponds to the centerline of the racetrack eroded from the target of a conventional planar magnetron, i.e., the position where the ion density is the highest, thus causing erosion cusping and quickly depleting the useful life of the target, when the magnetic flux is not tuned and the target is not modified. To maximize the amount of target material utilized, the racetrack centerline of the preferred embodiment may be extended lengthwise. This must be carefully controlled, however, as there is an "edge effect" from the target edges which can severely compromise the uniformity of the erosion.

Figure 7B:
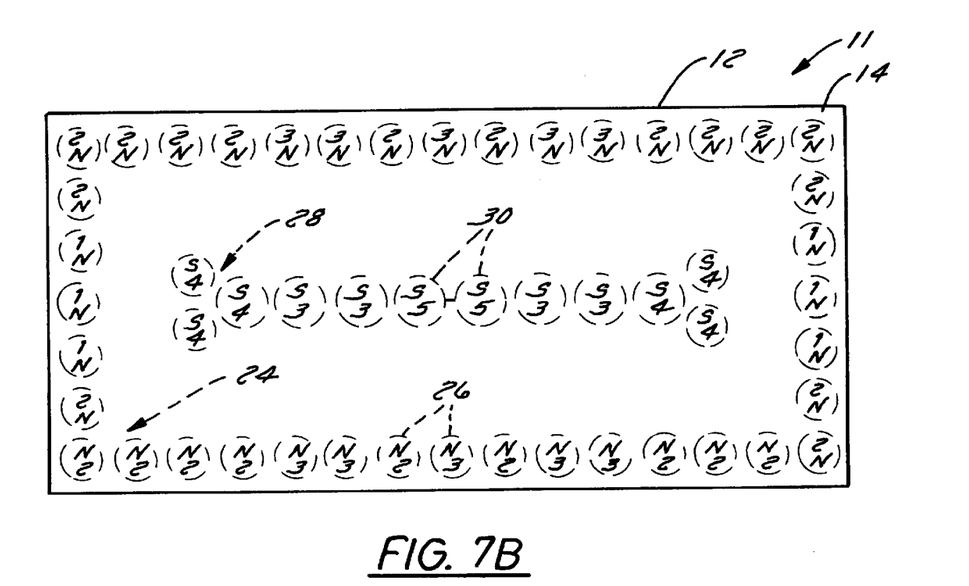
FIG. 7B is a top plan view of a cathode assembly of the preferred embodiment showing the magnet assemblies of the magnetron which produces a magnetic field having an in-plane component on a sculpted target surface as shown in FIG. 6A.

Once the racetrack centerline is determined, sculpted portions 16, 17 are formed in first surface 14 of target 12 and stacks of elements 44 are assembled for making magnetic field measurements. As mentioned previously, selecting combinations of elements for magnet assemblies 26, 30 is performed on a trial basis, with the designer collecting knowledge regarding the effects on the magnetic field caused by particular element combinations. FIGS. 7A and 7B illustrate the arrangement of the magnetic components that produced the magnetic field distributions shown in FIGS. 5A and 6A, i.e., the conventional un-tuned magnetic field distribution and the tuned magnetic field distribution of the present invention, respectively. The target is made of Nickel/Iron 18.6 wt. %.

The composition of the magnetic elements of the prior art cathode assembly and the composition of elements 44 of the magnet assemblies 26, 30 of the present invention are determined according to the following: the number "1" indicates three magnets, i.e., a full stack in the preferred embodiment, the number "2" indicates two magnets and one spacer, the number "3" indicates two magnets and one air gap, the number "4" indicates one magnet and one spacer, and the number "5" indicates two magnets and two-thirds of one spacer, while "S" and "N" indicate the polarity of the pole face away from the shunt plate (40 in FIG. 4). Further, note that when a spacer or an air gap is included in the stack, its location is furthest from the shunt plate, i.e., closest to the target.

As shown in FIG. 7A, all the elements of the inner and outer magnetic elements are the same, in other words, the field is untuned. As discussed previously, this magnetic field source produces an undesirable peak in the magnitude of the in-plane magnetic field (FIG. 5A) which is indicative of erosion cusping at the associated location (FIG. 1C). After conducting the process described above, the magnet assemblies 26, 30 have stacks composed of elements 44 in accordance with the above key. This arrangement produces the magnitude distribution of the in-plane component of the magnetic field depicted in FIG. 6B, thus providing uniform erosion of the target surface. Note that although not shown in FIG. 7B, the target surface is sculpted.

As an alternative to selecting different combinations of elements, the magnetics of field generator 22 can be tuned by moving the target, relative to the backing plate which causes changes in the shape of the magnitude distribution of the in-plane component of the magnetic field. Through trial and error, this relative movement of the target 12 can operate to equalize the two peaks of the in-plane component.

In sum, the desired result of properly tuning the elements of the cathode is maximizing the in-plane component of the magnetic pass through flux above the sculpted portions 16, 17, at the expense of the perpendicular components. The reshaping of the magnetic flux components above the sculpted portions directly provides a more uniform electron density and thereby provides a more uniform ionization cross-section at the proximity of the plasma sheath. This ultimately yields a more uniform pool of extractable ions resulting in balanced target erosion and significantly improved target utilization.

Figure 8A:
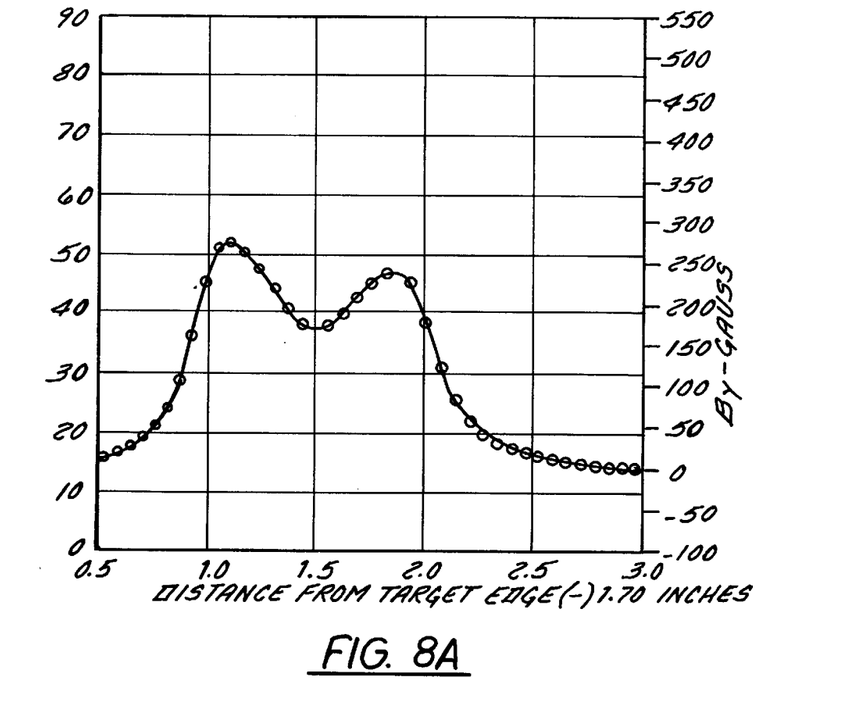
FIG. 8A is a diagram showing the in-plane component of the magnetic field generated on the sculpted target surface when the magnet assemblies of magnetic field generator shown in FIG. 4 are not optimally tuned according to the preferred embodiment.
Figure 8B:
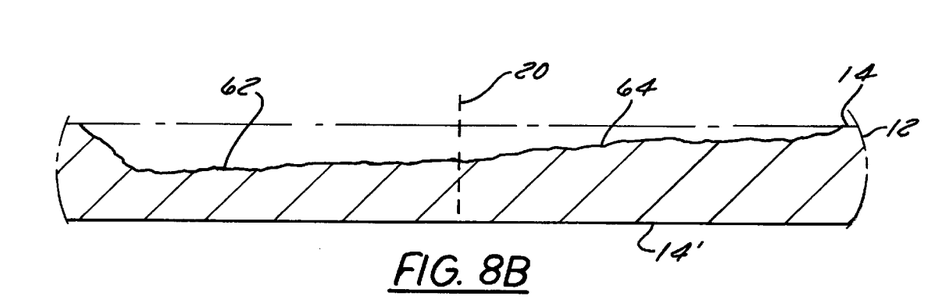
FIG. 8B is a partially broken away cross-sectional view similar to FIG. 3B showing the erosion caused by the magnetic field shown in FIG. 8A.

Next, as shown in FIG. 8A, the twin peaks "T" of the in-plane component of the magnetic field measured at location R1 (see FIG. 2) are not equal such that, in the preferred embodiment, the user should perform the tuning process described previously to achieve optimized erosion. Notably, the side of the centerline associated with the higher in-plane component of the magnetic field will be eroded faster than the opposite side of the centerline of the racetrack, as shown in FIG. 8B. Clearly, eroded surface 62 of sculpted section 16 is eroded more deeply than surface 64 of sculpted section 17. By making appropriate modifications to the elements 44 in the stacks of magnetic assemblies 26, 30, the user can achieve the desired equalization of the twin peaks of the in-plane component of the magnetic field. Note, however, that there may be some cases in which unbalanced peaks may in fact be desired to achieve deeper erosion on one side of the centerline provided that the twin peaks still exist to minimize erosion cusping near the centerline. By tuning the magnet assemblies 26, 30, nearly any type of erosion profile can be achieved.

Figure 9:
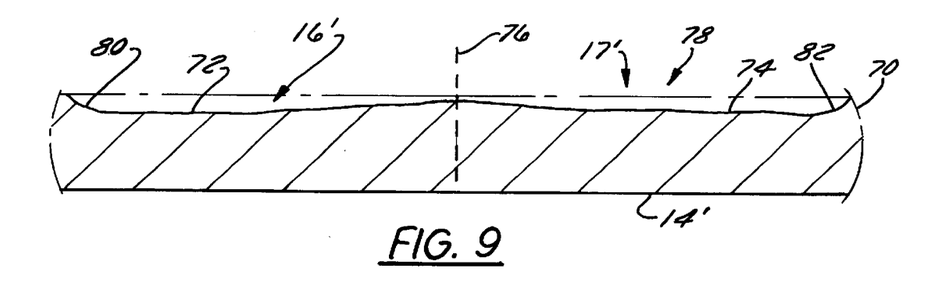
FIG. 9 is a partially broken away cross-sectional view of an alternate embodiment of the target of the present invention.

Turning to FIG. 9, an alternate embodiment of target 12 is shown. Rather than having a plurality of adjacent trenches as shown in FIG. 3A, target 70 has sculpted portions 16', 17' that comprise surfaces 72, 74, respectively, that are generally continuously downward sloping away from a centerline 76 of a racetrack 78 and which terminate in an end wall 80, 82, respectively. Target 70 realizes similar benefits as target 12 in terms of minimizing erosion cusping and extending target life, and affords additional benefits associated with manufacturing ease. In general, each design includes sculpted portions that are deeper at locations further from a racetrack centerline. This feature maximizes uniform erosion of the target surface to increase system uptime and decrease cost.

Although the best mode contemplated by the inventors of carrying out the present invention is disclosed above, practice of the present invention is not limited thereto. It will be manifest that various additions, modifications and rearrangements of the features of the present invention may be made without deviating from the spirit and scope of the underlying inventive concept.

What is claimed is:

1. A sculpted target for a sputtering apparatus, the target comprising:

a monolithic plate made of a soft magnetic material, the plate having a first surface and a center;

a sculpted section formed in the first surface, said sculpted section (1) being generally recessed from the first surface and extending around the center in a racetrack configuration, the racetrack having a concentric centerline, (2) being generally symmetric about the centerline, and wherein said sculpted section is formed so as to facilitate reducing energy input per unit area of the target surface; and wherein each said trench has an associated depth, said depths progressively increasing as the associated trenches are displaced generally further from the centerline.

2. A sculpted target for a sputtering apparatus, the target comprising:
a monolithic plate made of a soft magnetic material, the plate having a first surface and a center;
a sculpted section formed in the first surface, said sculpted section (1) being generally recessed from the first surface and extending around the center in a racetrack configuration, the racetrack having a concentric centerline, (2) being generally symmetric about the centerline, and wherein said sculpted section is formed so as to facilitate reducing energy input per unit area of the target surface; and
wherein said sculpted section includes an inner section and an outer section, said inner and outer sections divided by the centerline and sloping generally continuously downwardly away from the centerline.

3. A target for a sputtering apparatus, the target comprising:
a monolithic plate comprising a soft magnetic material, the plate having a first surface and a center;
a plurality of generally adjacent trenches formed in the first surface, said trenches extending around the center in a racetrack configuration;
wherein said racetrack configuration has a concentric centerline, and an equal number of said trenches flank either side of the centerline, and wherein said trenches vary in depth in a direction generally transverse to the centerline.

4. The target according to claim 3, wherein each said trench has an associated depth, said depths of said trenches progressively increasing further from the centerline.

5. A cathode assembly comprising:
a monolithic target having a first surface and a center region, wherein a sculpted section is formed in the first surface, said sculpted section being generally recessed from the first surface and extending around the center in a racetrack configuration, and wherein the racetrack has a concentric centerline, and said sculpted section is generally symmetric about the centerline;
a magnetic field generator disposed adjacent to the target, said magnetic field generator producing a magnetic field having an in-plane component; and
wherein said magnetic field generator is tuned so that a distribution of the magnitude of the in-plane component in a direction transverse to the centerline at a point along the racetrack is characterized by twin peaks that have a generally equal magnitude.

6. The cathode assembly according to claim 5, wherein said magnetic field generator is tuned by altering the magnetic field generator so that it produces a different magnetic field.

7. The cathode assembly according to claim 6, wherein said target has a planar surface, and said magnetic field generator comprises (1) a first array of magnet assemblies, the first magnet assemblies having a first pole disposed generally adjacent to the planar surface at about the center region, and (2) a second array of magnet assemblies, the second magnet assemblies having a second pole disposed generally adjacent to the planar surface generally outside the racetrack, wherein said first and second poles have opposite polarities.

8. The cathode assembly according to claim 7, further comprising a backing plate having a backing surface coupled to the planar surface, wherein each said magnet assembly is disposed in a corresponding opening formed in said backing plate.

9. The cathode assembly according to claim 7, wherein said magnet assemblies are releasably coupled to a shunt plate.

10. The cathode assembly according to claim 9, wherein said magnet assemblies are cylindrical.

11. The cathode assembly according to claim 9, wherein each said magnet assembly comprises a combination of stacked elements coupled to said shunt plate with a fastener, said combination for tuning the magnetic field generator.

12. The cathode assembly according to claim 11, wherein each said combination includes at least one of the following: a permanent magnet, an air gap and a spacer.

13. The cathode assembly according to claim 12, wherein said permanent magnet is neodyrnium-iron-boron ($N_dF_eB$).

14. The cathode assembly according to claim 12, wherein said spacer is a soft magnetic material.

15. A method of making a cathode assembly for sputtering a target made of a particular material, the method comprising:
using a target having a first surface to be sputtered and a second surface opposite the first surface;
forming a sculpted portion in the first surface;
disposing a magnetic field generator generally adjacent to the second surface to generate a magnetic field having an in-plane component;
tuning the magnetic field so as to avoid erosion cusping of the first surface during a sputtering operation;
wherein said sculpted portion has a racetrack configuration, wherein the racetrack has a concentric centerline; and
wherein said magnetic field generator includes a plurality of magnet assemblies having a stack of elements, and wherein said tuning step includes,
selecting a combination of the elements, the elements selected from a group including: a magnet, an air gap, and a spacer;
measuring the magnitude of the in-plane component of the magnetic field for each point along a line transverse to the centerline to create a magnitude distribution for the line;
repeating said selecting and said measuring steps until the distribution includes two peaks.

16. The method of claim 15, wherein the two peaks of the distribution are generally symmetrical about the centerline.

17. A sculpted target for a sputtering apparatus, the target comprising:
a monolithic plate made of a soft magnetic material, the plate having a first surface and a center;
a sculpted section formed in the first surface, said sculpted section (1) being generally recessed from the first surface and extending around the center in a racetrack configuration, the racetrack having a concentric centerline, and (2) being generally symmetric about the centerline; and
wherein said sculpted section includes a plurality of generally adjacent trenches formed in the first surface, wherein an equal number of said trenches flank either side of the centerline, and wherein each said trench has an associated depth, said depths progressively increasing as the associated trenches are displaced generally further from the centerline.

18. A sculpted target for a sputtering apparatus, the target comprising:
a monolithic plate made of a soft magnetic material, the plate having a first surface and a center;

a sculpted section formed in the first surface, said sculpted section (1) being generally recessed from the first surface and extending around the center in a racetrack configuration, the racetrack having a concentric centerline, and (2) being generally symmetric about the centerline; and wherein said sculpted section includes an inner section and an outer section, said inner and outer sections divided by the centerline and sloping generally continuously downwardly away from the centerline.

19. A target for a sputtering apparatus, the target comprising:

a monolithic plate comprising a soft magnetic material, the plate having a first surface and a center;

a plurality of generally adjacent trenches formed in the first surface, said trenches extending around the center in a racetrack configuration; and wherein said racetrack configuration has a concentric centerline, and an equal number of said trenches flank either side of the centerline, and wherein each said trench has an associated depth, said depths of said trenches progressively increasing further from the centerline.

20. A sculpted target for a sputtering apparatus, the target comprising:

a monolithic plate made of a soft magnetic material, the plate having a first surface and a center;

a sculpted section formed in the first surface, said sculpted section (1) being generally recessed from the first surface and extending around the center in a racetrack configuration, the racetrack having a concentric centerline, (2) being generally symmetric about the centerline, and wherein said sculpted section is formed so as to facilitate reducing energy input per unit area of the target surface; and wherein the depth of said sculpted section varies in a direction transverse to the centerline.

21. A sculpted target for a sputtering apparatus, the target comprising:

a monolithic plate made of a soft magnetic material, the plate having a first surface and a center;

a sculpted section formed in the first surface, said sculpted section (1) being generally recessed from the first surface and extending around the center in a racetrack configuration, the racetrack having a concentric centerline, (2) being generally symmetric about the centerline, and wherein said sculpted section is formed so as to facilitate reducing energy input per unit area of the target surface; and wherein said sculpted section includes a plurality of generally adjacent trenches formed in the first surface, wherein an equal number of said trenches flank either side of the centerline wherein each said trench has an associated width and associated depth, wherein, for each said trench, said associated depth is less than said associated width.

* * * * *